United States Patent
Lopatin et al.

(10) Patent No.: US 6,861,349 B1
(45) Date of Patent: Mar. 1, 2005

(54) METHOD OF FORMING AN ADHESION LAYER WITH AN ELEMENT REACTIVE WITH A BARRIER LAYER

(75) Inventors: Sergey D. Lopatin, Santa Clara, CA (US); Paul R. Besser, Sunnyvale, CA (US); Matthew S. Buynoski, Palo Alto, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/145,944

(22) Filed: May 15, 2002

(51) Int. Cl.[7] .......................................... H01L 21/4763
(52) U.S. Cl. ........................ 438/627; 438/628; 438/653
(58) Field of Search ................................ 438/627–628, 438/642–643, 650–651, 653, 522, 648, 622; 257/750–754, 762–764, 757

(56) References Cited

U.S. PATENT DOCUMENTS

| | | |
|---|---|---|
| 5,004,520 A | 4/1991 | Tsuji et al. |
| 5,224,520 A | 7/1993 | Shinbara et al. |
| 5,243,222 A | 9/1993 | Harper et al. |
| 5,300,462 A | 4/1994 | Kakumu |
| 5,552,341 A | 9/1996 | Lee |
| 5,654,245 A | 8/1997 | Allen |
| 5,770,517 A | 6/1998 | Gardner et al. |
| 5,821,168 A | 10/1998 | Jain |
| 5,882,738 A | 3/1999 | Blish, II et al. |
| 5,899,740 A | 5/1999 | Kwon |
| 5,969,422 A * | 10/1999 | Ting et al. .................... 257/762 |
| 6,015,749 A | 1/2000 | Liu et al. |
| 6,030,895 A | 2/2000 | Joshi et al. |
| 6,037,001 A * | 3/2000 | Kaloyeros et al. ........... 427/250 |
| 6,069,068 A | 5/2000 | Rathore et al. |
| 6,090,710 A | 7/2000 | Andricacos et al. |
| 6,096,648 A | 8/2000 | Lopatin et al. |
| 6,117,770 A * | 9/2000 | Pramanick et al. .......... 438/659 |
| 6,130,156 A * | 10/2000 | Havemann et al. .......... 438/637 |
| 6,156,638 A | 12/2000 | Agarwal et al. |
| 6,180,522 B1 | 1/2001 | Hong |
| 6,225,221 B1 | 5/2001 | Ho et al. |
| 6,242,808 B1 | 6/2001 | Shimizu et al. |
| 6,268,291 B1 | 7/2001 | Andricacos et al. |
| 6,294,463 B1 | 9/2001 | Tseng |
| 6,294,836 B1 * | 9/2001 | Paranjpe et al. ............. 257/767 |
| 6,297,146 B1 | 10/2001 | Lopatin |
| 6,344,413 B1 * | 2/2002 | Zurcher et al. .............. 438/678 |
| 6,365,502 B1 * | 4/2002 | Paranjpe et al. ............. 438/622 |
| 6,399,496 B1 | 6/2002 | Edelstein et al. |

(List continued on next page.)

FOREIGN PATENT DOCUMENTS

| | | |
|---|---|---|
| EP | 0 567 867 A2 | 11/1993 |
| EP | 1 039 531 A2 | 9/2000 |
| EP | 1 039 531 A3 | 12/2000 |
| EP | 1 094 515 A2 | 4/2001 |

OTHER PUBLICATIONS 4.7.3 General Reliability Issues Associated with IC Interconnects; Silicon Processing for the VLSI Era; vol. 11, pp. 264–265

(List continued on next page.)

Primary Examiner—Long Pham
Assistant Examiner—Thao X. Le
(74) Attorney, Agent, or Firm—Foley & Lardner LLP

(57) ABSTRACT

A method of fabricating an integrated circuit can include forming a barrier material layer along lateral side walls and a bottom of a via aperture which is configured to receive a via material that electrically connects a first conductive layer and a second conductive layer, implanting a first alloy element into an interfacial layer over the barrier material layer, depositing an alloy layer over the interfacial layer. The implanted first alloy element is reactive with the barrier material layer to increase resistance to copper diffusion.

20 Claims, 3 Drawing Sheets

U.S. PATENT DOCUMENTS

| | | |
|---|---|---|
| 6,410,383 B1 | 6/2002 | Ma |
| 6,420,262 B1 | 7/2002 | Farrar |
| 6,423,289 B1 | 7/2002 | Klatte |
| 6,423,633 B1 | 7/2002 | Tseng |
| 6,426,289 B1 | 7/2002 | Farrar |
| 6,461,675 B2 * | 10/2002 | Paranjpe et al. ............ 427/250 |
| 6,465,867 B1 | 10/2002 | Bernard et al. |
| 6,482,734 B1 | 11/2002 | Ha et al. |
| 6,482,740 B2 * | 11/2002 | Soininen et al. ............ 438/686 |
| 6,500,749 B1 | 12/2002 | Liu et al. |
| 6,521,532 B1 * | 2/2003 | Cunningham ............... 438/687 |
| 6,534,865 B1 | 3/2003 | Lopatin et al. |
| 6,589,874 B2 | 7/2003 | Andricacos et al. |
| 6,605,874 B2 * | 8/2003 | Leu et al. ................... 257/758 |
| 6,703,307 B2 * | 3/2004 | Lopatin et al. ............. 438/653 |
| 2001/0035237 A1 | 11/2001 | Nagano et al. |
| 2002/0036309 A1 * | 3/2002 | Sekiguchi et al. .......... 257/301 |
| 2002/0039542 A1 | 4/2002 | Bogel et al. |
| 2002/0053741 A1 * | 5/2002 | Iwasaki et al. ............. 257/762 |
| 2002/0076925 A1 * | 6/2002 | Marieb et al. ............. 438/678 |
| 2002/0084529 A1 * | 7/2002 | Dubin et al. ................ 257/774 |
| 2002/0102838 A1 * | 8/2002 | Paranjpe et al. ............ 438/622 |
| 2002/0109233 A1 * | 8/2002 | Farrar ........................ 257/762 |
| 2002/0137332 A1 * | 9/2002 | Paranjpe et al. ............ 438/637 |

OTHER PUBLICATIONS

James A. Cunningham, "Improving Copper Interconnects: A Search for Useful Dopants," Semiconductor International, (Apr., 2000), pp. 1–8.

Dong Joon Kim et al, "New Method to Prepare W–B$^{\alpha}$–N Tenrary Barrier to Cu diffusion by Implanting $BF_2^+$ Ions Into W–N Thin Flim," J. Vac. Sci. Technol. B 17(4), Jul./Aug., 1999, pp. 1598–1601.

W. F. McArthur et al., "Structural and Electrical Characterization of Si–Implanted Tin as a Diffusion Barrier for Cu Metallization," Mat. Res. Soc. Symp. Proc. vol. 391, 1995, pp. 327–332.

PCT International Search Report, International Application No. PCT/US 02/32605, International Filing Date Nov. 10, 2002 (7 pages).

PCT International search Report, International Application No. PCT/US 02/32554, International Filing Date Nov. 10, 2002 (5 pages).

* cited by examiner

US 6,861,349 B1

METHOD OF FORMING AN ADHESION LAYER WITH AN ELEMENT REACTIVE WITH A BARRIER LAYER

CROSS REFERENCE TO RELATED APPLICATIONS

This application is related to U.S. patent application Ser. No. 09/994,397, entitled METHOD OF IMPLANTING COPPER BARRIER MATERIAL TO IMPROVE ELECTRICAL PERFORMANCE filed on Nov. 26, 2001; U.S. patent application Ser. No. 09/994,400, entitled METHOD OF INSERTING ALLOY ELEMENTS TO REDUCE COPPER DIFFUSION AND BULK DIFFUSION filed on Nov. 26, 2001; U.S. patent application Ser. No. 09/994,358, entitled METHOD OF IMPLANTATION AFTER COPPER SEED DEPOSITION filed on Nov. 26, 2001; U.S. patent application Ser. No. 09/994,395, entitled METHOD OF USING TERNARY COPPER ALLOY TO OBTAIN A LOW RESISTANCE AND LARGE GRAIN SIZE INTERCONNECT filed on Nov. 26, 2001; and U.S. patent application Ser. No. 10/123,751, entitled USE OF ULTRA-LOW ENERGY ION IMPLANTATION (ULEII) TO FORM ALLOY LAYERS IN COPPER; which are all assigned to the same assignee as this application.

FIELD OF THE INVENTION

The present invention relates generally to integrated circuits and methods of manufacturing integrated circuits. More particularly, the present invention relates to forming an adhesion layer with an element reactive with a barrier layer.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize vias to connect structures (e.g., gates, drain regions, source regions) and conductive lines. For example, a via can connect a gate above the substrate to a conductor line in a metal 1 layer. Vias can also interconnect conductive lines. For example, a via can connect a conductive line in a metal 1 layer to a conductor line in a metal 2 layer. A via is typically a metal plug which extends through an insulative layer in a multilayer integrated circuit. Vias and barrier layers are discussed in U.S. Pat. Nos. 5,646,448; 5,770,519; and 5,639,691; each of which are assigned to the assignee of the present application. A barrier layer is used to protect the via and insulative layer from metal diffusion and the via and conductive line from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, metals are most susceptible to electromigration at very high current density and temperatures of 100° C. or more.

Integrated circuit manufacturers have attempted to reduce via resistance as the via size decreases by reducing the thickness of the barrier material. According to a conventional plasma vapor deposition (PVD) process, IC manufacturers deposit a very thin barrier material at the bottom of the via due to non-conformal deposition. The thickness of the barrier material is reduced by chemical vapor deposition (CVD) or atomic layer deposition (ALD) processes. These advanced deposition processes form highly conformal barrier metal films. However, reducing the barrier thickness causes the barrier to become more permeable to copper (Cu) diffusion, which can adversely affect resistance to electromigration.

A conventional integrated circuit can include a copper layer, a copper via, a copper layer, a dielectric layer, and a dielectric layer. The via and copper layer are separated by a barrier layer.

The integrated circuit can also include a dielectric layer that is separated from the copper layer by an etch stop layer. The dielectric layer can be oxide and the etch stop layer can be Silicon Nitride (SiN). The etch stop layer prevents diffusion of copper from the copper layer into the dielectric layer. The dielectric layer can be separated from the copper layer by a barrier layer. Barrier layers can be Tantalum Nitride (TaN). Etch stop layers can be Silicon Nitride (SiN).

According to conventional processes, the barrier layer can have a cross-sectional thickness of between 7 nm to 25 nm. The barrier layer inhibits diffusion of copper ions from layers into the via and from the via into the dielectric layer. Conventional barrier layers can include Tantalum Nitride (TaN).

As discussed above, conventional systems have attempted to reduce the thickness of the barrier layer to reduce the resistance associated with the via. However, this reduction in thickness can cause electromigration failures.

Electromigration failures have been described by Stanley Wolf, Ph.D. in Silicon Processing for the VLSI Era, Lattice Press, Sunset Beach, Calif., Vol. 2, pp. 264–65 (1990). Dr. Wolf explains that a positive divergence of the motion of the ions of a conductor leads to an accumulation of vacancies, forming a void in the metal. Such voids may ultimately grow to a size that results in open-circuit failure of the conductor line.

Thus, there is a need for a barrier that is more resistant to copper diffusion. Further, there is a need for a method of forming an adhesion layer with an element reactive with a barrier layer to improve resistance to copper diffusion. Even further, there is a need for a method of enhancing barrier properties by providing an adhesion layer as an interfacial layer between a barrier layer and a copper layer.

SUMMARY OF THE INVENTION

An exemplary embodiment is related to a method of fabricating an integrated circuit. This method can include forming a barrier material layer along lateral side walls and a bottom of a via aperture that is configured to receive a via material that electrically connects a first conductive layer and a second conductive layer, implanting a first alloy element into an interfacial layer over the barrier material layer, and implanting an alloy layer over the interfacial layer. The implanted first alloy element is reactive with the barrier material layer to increase resistance to copper diffusion.

Another exemplary embodiment is related to a method of implanting an adhesion layer between a barrier layer and an alloy layer to improve electrical performance in an integrated circuit fabrication process. This method can include providing a copper layer over an integrated circuit substrate, providing a barrier material at a bottom and sides of a via aperture in a dielectric layer positioned over the copper layer to form a barrier layer separating the via aperture from the copper layer, depositing an adhesion layer over the barrier layer thereby making the barrier layer more resistant to copper diffusion from the copper layer, and filling the via aperture with a via material and an alloy element.

Another exemplary embodiment is related to a method of forming a via in an integrated circuit. This method can include depositing a copper layer, depositing an etch stop layer over the copper layer, depositing an insulating layer over the etch stop layer, forming an aperture in the insulating layer and the etch stop layer, providing a barrier material at a bottom and sides of the aperture to form a barrier material layer providing separation from the copper layer, implanting a first alloy element into an interfacial layer over the barrier material layer, filling the aperture with a via material including a second alloy element to form a via, and providing a conductive layer over the via such that the via electrically connects the conductive layer to the copper layer. The implanted first alloy element is reactive with the barrier material layer to increase resistance to copper diffusion from the copper layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
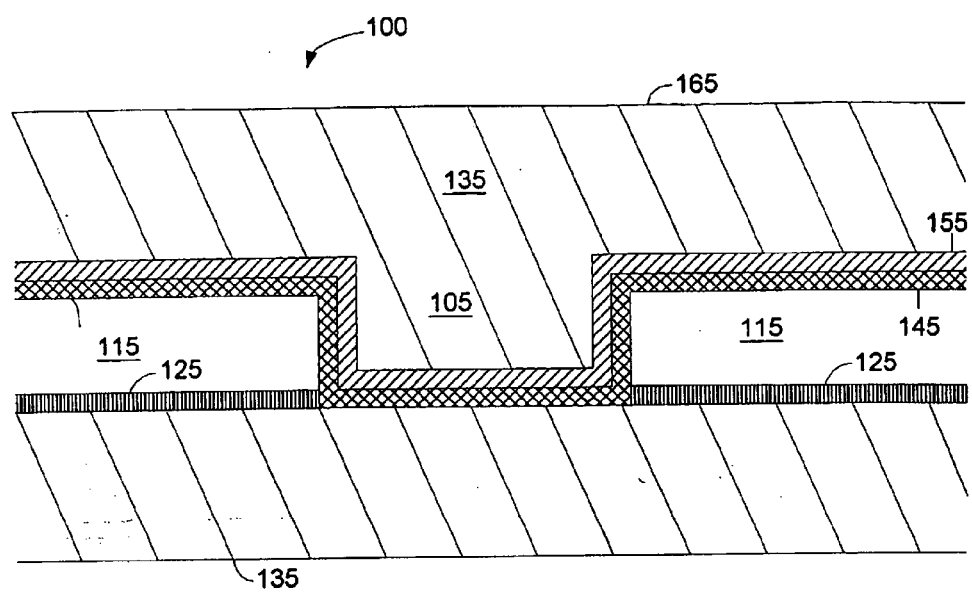
FIG. 1 is a schematic cross-sectional view representation of a portion of an integrated circuit, showing an adhesion layer in accordance with an exemplary embodiment.

With reference to FIG. 1, a schematic cross-sectional view representation of a portion 100 of an integrated circuit (IC) includes an aperture 105, a dielectric layer 115, an etch stop layer 125, a copper layer 135, a barrier layer 145, an adhesion layer 155, and a copper alloy layer 165. Portion 100 is preferably part of an ultra-large-scale integrated (ULSI) circuit having millions or more transistors. Portion 100 is manufactured as part of the IC on a semiconductor wafer, such as, a silicon wafer.

Aperture 105 is formed in preparation for the creation of a via by etching a portion of dielectric layer 115 and etch stop layer 125. In an exemplary embodiment, dielectric layer 115 is an oxide material and etch stop layer 125 is Silicon Nitride (SiN) or other suitable material. Etch stop layer 125 prevents diffusion of copper from copper layer 135 into dielectric layer 115.

Copper layer 135 can be a layer of copper positioned in proximate location to the via section associated with aperture 105. Copper layer 135 can be an alloy including copper (Cu). In an alternative embodiment, copper layer 130 is a stack of several layers.

Barrier layer 145 can be Tantalum (Ta), Titanium Nitride (TiN), Titanium Silicon Nitride (TiSiN), Tungsten Nitride (WNx), or other suitable material. In an exemplary embodiment, barrier layer 145 has a cross sectional thickness of 7–15 nm. In other embodiments, barrier layer 145 can have smaller dimensions, such as 3–7 nm. The barrier properties of barrier layer 145 can be enhanced by the addition of an implant.

In an exemplary method of fabricating portion 100, once copper layer 135 is created, etch stop layer 125 is deposited over copper layer 135 and dielectric layer 115 is deposited over etch stop layer 125. A resist layer is then deposited over dielectric layer 115. The resist layer is used in the patterning and etching in dielectric layer 115 and etch stop layer 125 to form aperture 105. The resist layer is removed before depositing via material in aperture 105 and depositing a conductive layer electrically connected to copper layer 135 by the via.

In an exemplary embodiment, via material can be formed in the via as follows. A Cu surface is treated with Ar ion sputtering and/or ammonia plasma, contaminating the Cu surface. A barrier (e.g., TaN, WN, TiSiN) is deposited on the treated Cu surface by a PVD or conformal ALD or CVD process. After the barrier is deposited, reactive element is ion implanted into the barrier surface layer and a Cu alloy seed (e.g., CuSn, CuZn, CuAg) is deposited over the barrier surface layer using an electroless process. A Cu conductor material can be deposited by electroplating or electroless. Finally, an anneal and a chemical mechanical polish (CMP) are applied.

In an alternative embodiment, via material can be formed in the via as follows. A Cu surface is treated with Ar ion sputtering and/or ammonia plasma. A barrier is deposited over the treated Cu surface by a conformal ALD or CVD process in the temperature range of 150–270° Celcius. After the barrier is deposited, an alloy seed is deposited and a reactive element is ion implanted through the deposited seed into a seed/barrier interface. A Cu conductor material can be deposited by electroplating or electroless. Finally, an anneal and a chemical mechanical polish (CMP) are applied.

Before depositing via material in aperture 105, an alloy element can be inserted to form adhesion layer 155 over barrier layer 145. In an exemplary embodiment, adhesion layer 155 is provided at the barrier interface after physical vapor deposition (PVD) or chemical vapor deposition (CVD). Adhesion layer 155 can include an element that is reactive with barrier layer 145. Adhesion layer 155 can include an element, such as, Iridium (Ir), Ruthenium (Ru), Rhenium (Re), or other suitable material. The alloy element for adhesion layer 155 can be applied at a dose of $2e^{14}$ atoms/cm$^2$ or $2e^{15}$ atoms/cm$^2$ and applied at an energy of, for example, 0.5 to 5 keV.

Advantageously, adhesion layer 155 provides for an improved copper barrier at barrier layer 145, thereby making barrier layer 145 more resistant to copper diffusion and less susceptible to electromigration. The formation of adhesion layer 155 can be part of the deposition process of copper alloy layer 165. Alternatively, adhesion layer 155 and copper alloy layer 165 are provided in separate steps.

Figure 2:
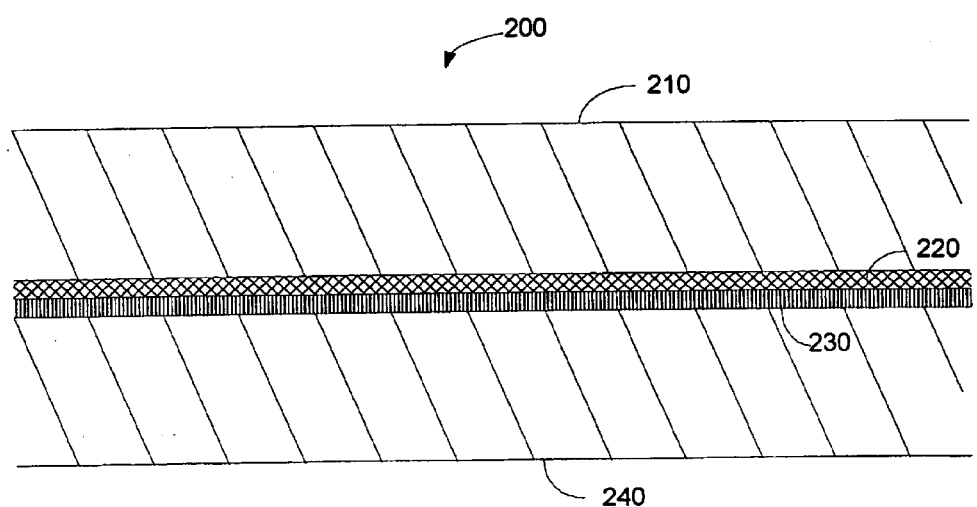
FIG. 2 is a schematic cross-sectional view representation of a portion of an integrated circuit, showing an adhesion layer in accordance with another exemplary embodiment.

Referring to FIG. 2, a portion 200 of an integrated circuit includes a copper alloy layer 210, an adhesion layer 220, barrier layer 230, and a dielectric layer 240. Copper alloy layer 210 can have a thickness of 30 nm or more. Adhesion layer 220 provides an interface between copper alloy layer 210 and barrier layer 230. Adhesion layer 220 can include an element of Iridium (Ir), Ruthenium (Ru), or Rhenium (Re). Adhesion layer 220 can have a thickness of 2–5 nm.

Figure 3:
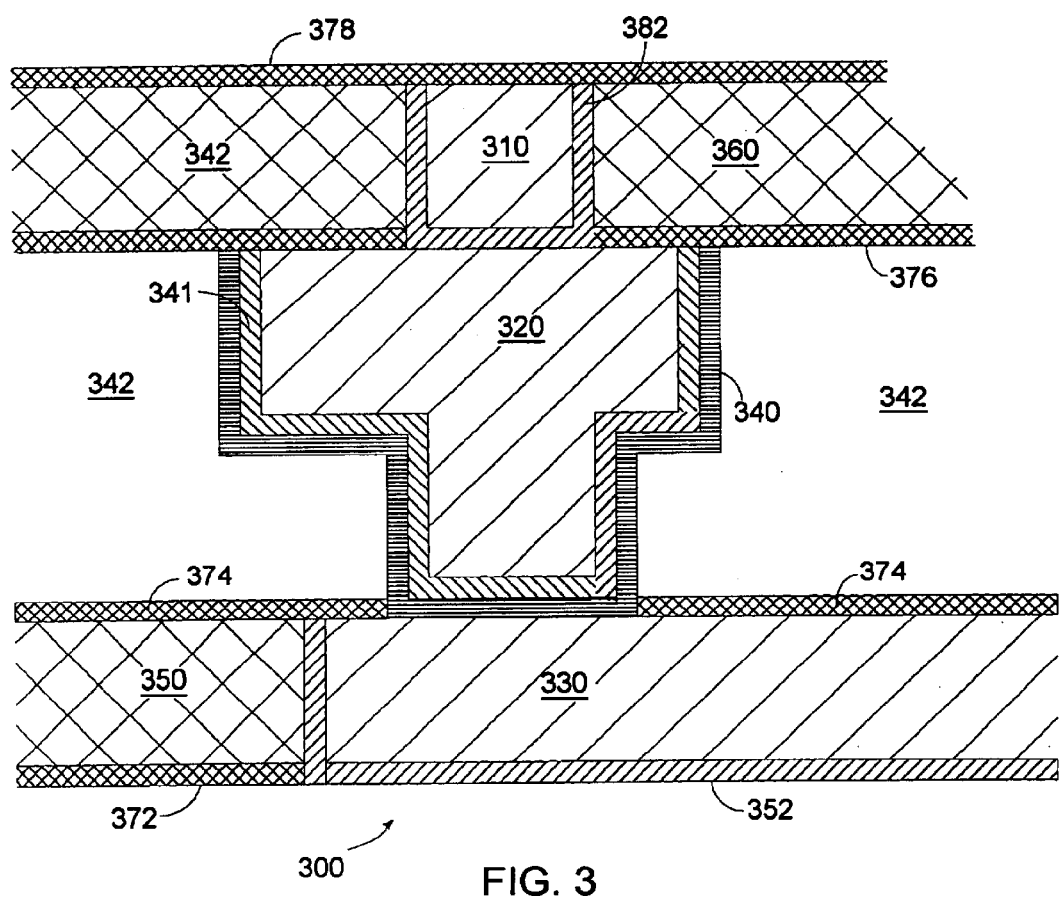
FIG. 3 is a perspective cross-sectional view representation of a portion of an integrated circuit, showing a ternary copper interconnect in accordance with an exemplary embodiment.

FIG. 3 illustrates a schematic cross-sectional view representation of a dual damascene portion 300 of an integrated circuit (IC), including a conductive layer 310, a via/trench section 320, a conducive layer 330, a barrier layer 340, a dielectric layer 350, and a dielectric layer 360. Portion 300 includes an adhesion layer 341 separating barrier layer 340 and via/trench section 320. Portion 300 also includes a dielectric layer 342 that is separated from conductive layer 330 by an etch stop layer 374.

Dielectric layers can include low dielectric constant materials deposited by CVD or spin-on techniques. CVD SiCOH film can serve as dielectric layer. Organic spin-on material such as "Silk" from Dow Chemicals, Co. also can serve as dielectric layer. Low dielectric constant materials can have dielectric constant below 3.5, such as k=1.5–3.5 and can include porous materials with porosity between 10 and 45%. Pore size can have dimensions of 1–15 nm. Porous dielectric can be formed by CVD or spin-on deposition followed by thermal treatments to form pores distribution.

Dielectric layer 350 can be separated from copper layer 330 by a barrier layer 352. Similarly, dielectric layer 360 can be separated from copper via layer 310 by a barrier layer 382. Barrier layers 352 and 382 can be Tantalum Nitride (TaN). Etch stop layers 372, 374, 376, and 378 can be Silicon Nitride (SiN).

Adhesion layer 341 can include an element that is reactive with barrier layer 340. Example elements include Ir, Ru, and Re. Adhesion layer 341 can be formed as part of the process of providing via/trench section 320 or as a separate formation step. Adhesion layer 341 can have a thickness of 2–5 nm.

Figure 4:
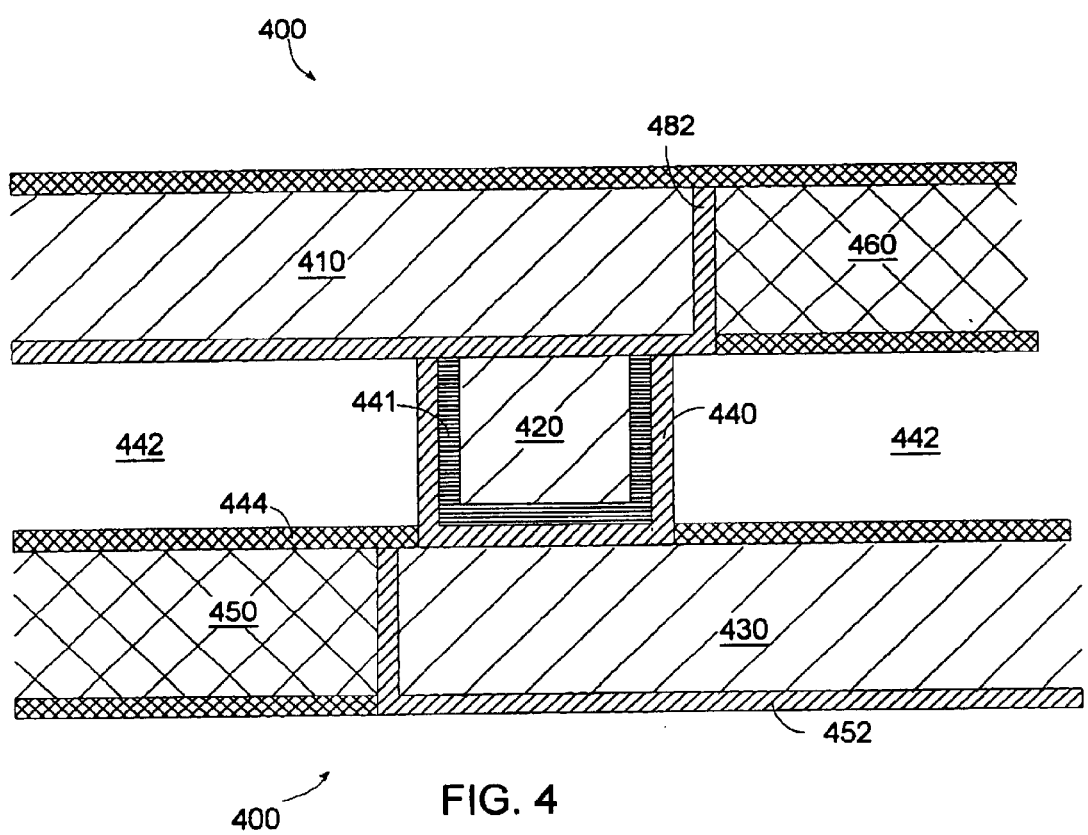
FIG. 4 is a perspective cross-sectional view representation of a portion of an integrated circuit, showing a ternary copper interconnect in accordance with another exemplary embodiment.

FIG. 4 illustrates a schematic cross-sectional view representation of a single damascene portion 400 of an integrated circuit, including a conductive layer 410, a via section 420, a conductive layer 430, a barrier layer 440, a dielectric layer 450, and a dielectric layer 460. Portion 400 includes an adhesion layer 441 serving as the interface between via section 420 and barrier layer 440. Portion 400 also includes a dielectric layer 442 that is separated from conductive layer 430 by an etch stop layer 444. Dielectric layer 460 can be separated from conductive layer 410 by a barrier layer 482.

Adhesion layer 441 can include a ternary copper alloy that is reactive with barrier layer 440. Advantageously, use of a ternary copper alloy in the formation of vias or interconnects can provide improved reliability and performance. For example, electromigration reliability can be improved due to staffed grain boundaries. Further, electromigration is improved due to increased grain size.

While the exemplary embodiments illustrated in the figures and described above are presently preferred, it should be understood that these embodiments are offered by way of example only. Other embodiments may include, for example, different methods of implanting copper alloys and different elements into alloys. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

forming a barrier material layer along lateral side walls and a bottom of a via aperture, the via aperture being configured to receive a via material that electrically connects a first conductive layer and a second conductive layer;

forming an interfacial layer over the barrier material layer by implanting a first alloy element into the barrier material layer, the implanted first alloy element being reactive with the barrier material layer to increase resistance to copper diffusion;

depositing a copper seed layer over the interfacial layer; and depositing a film material including copper over the copper seed layer by plating.

2. The method of claim 1, wherein the implanted first alloy element is selected from a group of metals which upon implanting make the interfacial layer an adhesion layer.

3. The method of claim 1, where in the barrier material layer is Tantalum (Ta), Tantalum Nitride (TaN), Titanium Nitride (TiN), titanium Silicon Nitride (TiSiN) or Tungsten Nitride (WNx).

4. The method of claim 1, wherein the implanted first alloy element is selected from a group consisting of Rhenium (Re).

5. The method of claim 1, wherein the interfacial layer has a thickness of 2–3 nm.

6. The method of claim 1, wherein the barrier material layer has a thickness of 3–7 nm.

7. The method of claim 1, further comprising forming a via aperture in a dielectric layer over a copper layer.

8. The method of claim 1, wherein the implanting is performed after the copper seed layer is deposited.

9. The method of claim 8, wherein the alloy layer includes an element of Re.

10. A method of implanting an adhesion layer between a barrier layer and an alloy layer to improve electrical performance in an integrated circuit fabrication process, the method comprising:

providing a copper layer over an integrated circuit substrate;

providing a barrier material at a bottom and sides of a via aperture in a dielectric layer positioned over the copper layer to form the barrier layer separating the via aperture from the copper layer;

providing the adhesion layer over the barrier layer by depositing an alloy into the barrier material, thereby making the barrier layer more resistant to copper diffusion from the copper layer; and filling the via aperture with a seed layer and a via material, the via material being provided by plating.

11. The method of claim 10, wherein the adhesion layer has a thickness of 2–5 nm.

12. The method of claim 10, further comprising providing a conductive layer over the via material such that the via material electrically connects the conductive layer to the copper layer.

13. The method of claim 10, wherein the adhesion layer includes an element reactive with the barrier layer, the element being selected from a group consisting of Rhenium (Re).

14. The method of claim 10, wherein the barrier material layer has a thickness of 3–7 nm.

15. A method of forming a via in an integrated circuit, the method comprising:

depositing a copper layer;

depositing an etch stop layer over the copper layer;

depositing an insulating layer over the etch stop layer;

forming an aperture in the insulating layer and the etch stop layer;

providing a barrier material at a bottom and sides of the aperture to form a barrier material layer providing separation from the copper layer;

providing an interfacial layer over the barrier material layer by implanting a first alloy element into the barrier layer, the implanted first alloy element being reactive with the barrier material layer to increase resistance to copper diffusion from the copper layer;

filling the aperture with a seed layer and a via material to form a via; and providing a conductive layer over the via such that the via electrically connects the conductive layer to the copper layer.

16. The method of claim 15, wherein the interfacial layer has a thickness of 2–5 nm.

17. The method of claim 15, further comprising providing a chemical mechanical polish to level the via material in the aperture.

18. The method of claim 15, wherein the barrier material layer has a cross-sectional thickness of 3–7 nm.

19. The method of claim 15, wherein the barrier material layer and the copper layer form an intermettallic.

20. The method of claim 15, wherein the second alloy element is selected from a group consisting of Rhenium (Re).

* * * * *